(12) United States Patent
Lee et al.

(10) Patent No.: US 10,205,861 B2
(45) Date of Patent: *Feb. 12, 2019

(54) TRANSMISSIVE OPTICAL SHUTTER AND METHOD OF FABRICATING THE SAME (71) Applicant: SAMSUNG ELECTRONICS CO., LTD., Suwon-si (KR)

(72) Inventors: Sanghun Lee, Seoul (KR); Changyoung Park, Yongin-si (KR); Yonghwa Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 574 days.

This patent is subject to a terminal disclaimer.

(21) Appl. No.: 14/719,850

(22) Filed: May 22, 2015

(65) Prior Publication Data
US 2016/0057404 A1 Feb. 25, 2016

(30) Foreign Application Priority Data
Aug. 19, 2014 (KR) .................. 10-2014-0107762

(51) Int. Cl.
G02F 1/015 (2006.01)
H04N 5/225 (2006.01)
G02F 1/017 (2006.01)

(52) U.S. Cl.
CPC .......... *H04N 5/2254* (2013.01); *G02F 1/017* (2013.01); *H04N 5/2257* (2013.01); *G02F 2001/0155* (2013.01)

(58) Field of Classification Search
CPC ...................................................... G02F 1/015
See application file for complete search history.

(56) References Cited

U.S. PATENT DOCUMENTS

| | | | | |
|---|---|---|---|---|
| 6,331,911 | B1* | 12/2001 | Manassen | B82Y 20/00 257/14 |
| 7,719,746 | B2* | 5/2010 | Goetz | B82Y 20/00 359/237 |
| 8,432,599 | B2 | 4/2013 | Cho et al. | |
| 8,675,272 | B2 | 3/2014 | Cho et al. | |
| 9,182,614 | B2* | 11/2015 | Cho | G02F 1/015 |
| 9,671,627 | B2* | 6/2017 | Lee | G02F 1/017 |
| 2002/0048076 | A1* | 4/2002 | Kondo | G02F 1/0356 359/322 |
| 2002/0125485 | A1* | 9/2002 | Steigerwald | H01L 33/02 257/79 |
| 2012/0140309 | A1* | 6/2012 | Cho | B82Y 20/00 359/260 |
| 2012/0257850 | A1* | 10/2012 | Fujikata | G02F 1/025 385/3 |
| 2013/0077150 | A1* | 3/2013 | Lee | G02F 1/017 359/248 |

(Continued)

Primary Examiner — Charlie Y Peng
(74) Attorney, Agent, or Firm — Sughrue Mion, PLLC (57) ABSTRACT A transmissive optical shutter and a method of fabricating the same are provided. The transmissive optical shutter includes a first contact layer, an epitaxial layer disposed over the first contact layer, the epitaxial layer being configured to modulate intensity of incident light having a specific wavelength, a second contact layer disposed on the epitaxial layer, a first electrode disposed on the first contact layer, at least one second electrode disposed on the second contact layer, and a substrate disposed under the first contact layer.

18 Claims, 6 Drawing Sheets (56) References Cited

U.S. PATENT DOCUMENTS

2013/0175500 A1 7/2013 Cho et al.
2013/0270418 A1 10/2013 Cho et al.
2014/0063583 A1 3/2014 Lee et al.
2015/0160481 A1 6/2015 Park et al.

\* cited by examiner

TRANSMISSIVE OPTICAL SHUTTER AND METHOD OF FABRICATING THE SAME

RELATED APPLICATION

This application claims priority from Korean Patent Application No. 10-2014-0107762, filed on Aug. 19, 2014, in the Korean Intellectual Property Office, the disclosure of which is incorporated herein in its entirety by reference.

BACKGROUND

1. Field

Apparatuses and methods consistent with exemplary embodiments relate to a transmissive optical shutter and a method of fabricating the same.

2. Description of the Related Art

In recent years, there has been a growing interest in three-dimensional (3D) camera module capable of providing 3D images simulating a high sense of reality. In particular, with the development of 3D display devices capable of displaying images having a strong sense of depth, demand for the 3D display devices has increased. As a result, more attention has been given to 3D content. Thus, research has been conducted on various kinds of 3D image capturing devices that allow ordinary consumers to directly produce 3D content.

Depth information regarding the distances between the surfaces of an object and a 3D image capturing device may be typically obtained using a Time-of-Flight (TOF) method. According to the TOF method, a time needed for a photodiode (PD) to receive light reflected by a photographed object after laser beams are radiated to the object is measured. In the TOF method, light having a specific wavelength (e.g., infrared (IR) light having a wavelength of about 850 nm or more) may be projected onto the object from a light emitting diode (LED) or a laser diode (LD). Light having the same wavelength may be received by the PD after it is reflected by the object. Thereafter, a process for determining distance information may be performed. For example, the amplitude of the reflected light may be modulated using an optical shutter, and a phase delay may be measured by capturing an image of the modulated reflected light using an imaging device, such as a charge-coupled device (CCD) or a complementary metal-oxide-semiconductor (CMOS) device. Specifically, a brightness image may be obtained by accumulating or sampling the amount of light incident onto the imaging device for a predetermined amount of time, and a phase delay and a distance may be determined based on the brightness image. According to the above-described modulation method, an optical shutter capable of modulating light at an ultrahigh speed of several tens of MHz to several hundred MHz is needed to determine a precise phase delay.

Recently, a gallium arsenide (GaAs) semiconductor-based optical shutter, which can be easily manufactured to have a small size and enable low-voltage ultrahigh-speed operations, has been proposed. The GaAs-based optical shutter may include a multiple quantum well (MQW) layer between a P-electrode and an N-electrode so that light is absorbed in the MQW layer when a reverse bias voltage is applied to both the P-electrode and the N-electrode. The GaAs-based optical shutters may be broadly classified into a reflective optical shutter and a transmissive optical shutter. In particular, when the transmissive optical shutter is used, an optical system of a 3D image capturing device may be very simply configured. Thus, use of the transmissive optical shutter may facilitate miniaturization of 3D image capturing devices.

SUMMARY

One or more exemplary embodiments of a transmissive optical shutter may be fabricated at a wafer level. One or more exemplary embodiments of a method of fabricating a transmissive optical shutter at a wafer level is described. In the case of a conventional transmissive optical shutter, when incident light cannot be transmitted through a substrate of the transmissive optical shutter, an opening needs to be formed in the substrate by using an additional removal process. Thus, an additional removal process is required, and an unnecessary loss of a usable region may occur.

According to an aspect of an exemplary embodiment, there is provided a transmissive optical shutter including a first contact layer, an epitaxial layer disposed over the first contact layer and configured to modulate intensity of incident light having a specific wavelength, a second contact layer disposed on the epitaxial layer, a first electrode disposed on the first contact layer, at least one second electrode disposed on the second contact layer, and a substrate disposed under the first contact layer.

The first contact layer, the epitaxial layer, and the second contact layers substantially transmit the incident light having a wavelength of 870 nm or more.

The transmissive optical shutter may further include an insulating frame disposed on the first contact layer, and the insulating frame may surround a side surface of the epitaxial layer.

A top surface of the insulating frame may be at the same level as a top surface of the second contact layer.

The transmissive optical shutter may further include an electrode pad disposed on the insulating frame, and the electrode pad may be electrically connected to the second electrode.

The transmissive optical shutter may further include a passivation layer that covers the second electrode and the second contact layer.

The epitaxial layer may include a first reflective layer being in contact with the first contact layer, a second reflective layer being in contact with the second contact layer, and an active layer interposed between the first reflective layer and the second reflective layer.

The first contact layer and the first reflective layer may be doped with a dopant of a first conductivity type, and the second contact layer and the second reflective layer may be doped with a dopant of a second conductivity type opposite the first conductivity type.

The epitaxial layer may be divided into a plurality of cells that form a two-dimensional matrix array.

The transmissive optical shutter may further include a support layer disposed under the substrate.

The support layer may include glass or sapphire.

The at least one second electrode comprises a plurality of second electrodes may be positioned on the second contact layer apart from one another. The transmissive optical shutter may further include a bus bar configured to electrically connect the at least one second electrode with an electrode pad The plurality of cells into which the epitaxial layer is divided may be spaced a predetermined distance apart from one another. The bus bar may extend along a region formed between the plurality of cells, and be connected to one end portion of the at least one second electrode.

The insulating frame may be disposed between the plurality of cells, and the bus bar may be disposed on the insulating frame.

According to an aspect of another exemplary embodiment, there is provided a method of fabricating a transmissive optical shutter, the method including sequentially stacking a first contact layer, an epitaxial layer, and a second contact layer on a substrate, etching the epitaxial layer and the second contact layer to expose a portion of the first contact layer, forming a first electrode on the exposed first contact layer, and forming at least one second electrode on the second contact layer.

The first contact layer, the epitaxial layer, and the second contact layers substantially transmit the incident light having a wavelength of 870 nm or more.

After forming the first electrode and before forming the at least one second electrode, the method may further include forming an insulating frame to cover the first contact layer and the first electrode and cover a side surface of the epitaxial layer.

The method may further include forming an electrode pad on the insulating frame to be electrically connected to the second electrode. The electrode pad and the second electrode may be formed simultaneously.

The method may further include forming a passivation layer to cover the second electrode and the second contact layer.

The method may further include forming a support layer under the substrate.

The sequential stacking of the first contact layer, the epitaxial layer, and the second contact layer on the substrate may be wholly performed in a semiconductor wafer process. The method may further include performing a dicing process after sequentially stacking the first contact layer, the epitaxial layer, and the second contact layer.

In a transmissive optical shutter according to an exemplary embodiment, incident light may be transmitted through a substrate without forming an opening in the substrate. Accordingly, an additional process for removing a portion of the substrate may not be required, and an unnecessary loss region caused by the removal process may be reduced to increase yield. Also, an optical region may be increased by adjusting a position of a connection portion of an electrode, so optical efficiency may be enhanced.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Reference will now be made in detail to exemplary embodiments, examples of which are illustrated in the accompanying drawings, wherein like reference numerals refer to like elements throughout. In this regard, apparatus and methods consistent with exemplary embodiments may have different forms and should not be construed as being limited to the descriptions set forth herein. Accordingly, exemplary embodiments are merely described below, by referring to the figures, to explain exemplary aspects. It will be understood that when an element or layer is referred to as being "over" or "on" another element or layer, it can be directly on the other element or layer or intervening elements or layers may be present.

Figure 1:
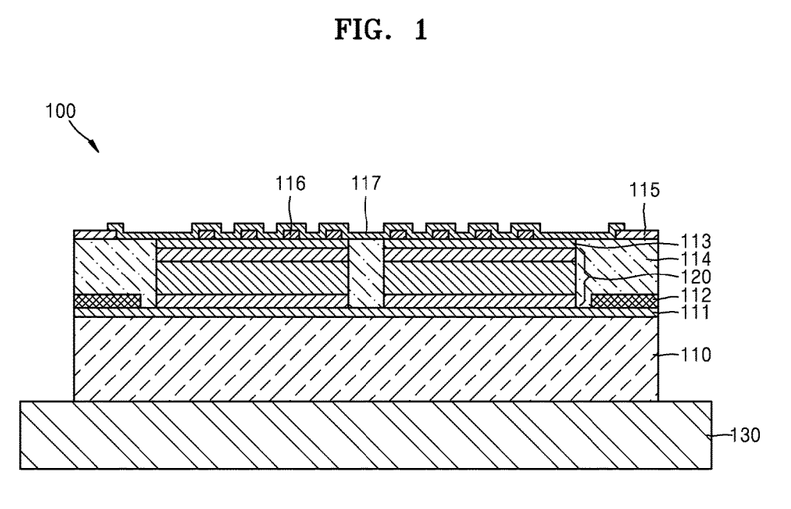
FIG. 1 is a schematic cross-sectional view of a transmissive optical shutter according to an exemplary embodiment.

FIG. 1 is a schematic cross-sectional view of a transmissive optical shutter 100 according to an exemplary embodiment. Referring to FIG. 1, the transmissive optical shutter 100 according to the present embodiment may include a substrate 110, a first contact layer 111 disposed on the substrate 110, an epitaxial layer 120 disposed on the first contact layer 111, a second contact layer 113 disposed on the epitaxial layer 120, a first electrode 112 disposed on the first contact layer 111, and at least one second electrode 116 disposed on the second contact layer 113. Also, the transmissive optical shutter 100 may further include an insulating frame 114 disposed on the first contact layer 111 to surround a side surface of the epitaxial layer 120, a passivation layer 117 disposed to cover the at least one second electrode 116 and the second contact layer 113, an electrode pad 115 disposed on the insulating frame 114, and a support layer 130 disposed under the substrate 110.

The substrate 110 may include, for example, silicon (Si), gallium arsenide (GaAs), or silicon carbide (SiC). Since the transmissive optical shutter 100 according to an exemplary embodiment is a transmissive type, incident light may be transmitted through the substrate 110. According to an exemplary embodiment, the substrate 110 may be formed of GaAs, which is a Group III-V compound semiconductor. A transmission rate of the substrate 110 formed of GaAs may depend on a wavelength band of incident light. When the transmissive optical shutter 100 uses a short infrared (IR) wavelength band of about 850 nm, for example, the GaAs substrate 110 cannot transmit light of such wavelength. As a result, an opening may be formed in the substrate 110 using an additional removal process such as an etching process. In contrast, when the transmissive optical shutter 100 uses a relatively long wavelength band, for example, a wavelength band of about 940 nm, the substrate 110 may transmit light having such a wavelength. Wavelengths above about 870 nm may be considered long enough to be used with a transmissive optical shutter. Accordingly, the transmissive optical shutter 100 may be fabricated without performing an additional removal process on a portion of the substrate 110. In this case, since an additional process for forming the opening is not needed, yield may be increased by reducing the number of fabrication process operations. Furthermore, since it is unnecessary to remove a portion of the substrate 110 to form an opening, regions of loss of the shutter structure may be reduced, and the entire transmissive optical shutter 100 may be reduced in size.

The epitaxial layer 120 may serve to modulate the intensity of incident light having a specific wavelength using an electro-absorption effect. To this end, as shown in FIG. 2, the epitaxial layer 120 may have a Fabry-Perot resonance structure in which an active layer 122 is disposed between two reflective layers 121 and 123.

For example, the active layer 122 may have a multiple quantum well (MQW) structure including a plurality of barrier layers 122b formed of aluminum gallium arsenide (AlGaAs) and a plurality of quantum well layers 122a formed of GaAs. Also, the active layer 122 may serve as a main cavity for Fabry-Perot resonance. To this end, the active layer 122 may be formed to have an optical thickness (a product of a physical thickness and a refractive index of a layer material) that is about equal to an integer multiple of $\lambda/2$ (here, $\lambda$ is a wavelength or resonance wavelength of incident light to be modulated). For example, in the transmissive optical shutter 100, $\lambda$ may be equal to or more than about 870 nm, which is in an IR wavelength band. In the transmissive optical shutter 100 according to an exemplary embodiment, $\lambda$ may be wavelength of about 940 nm.

First and second reflective layers 121 and 123 may be, for example, distributed Bragg reflectors (DBRs) formed by repetitively and alternately stacking low refractive index layers 121a and 123a having relatively low refractive indices and high refractive index layers 121b and 123b having relatively high refractive indices. Each of the low refractive index layers 121a and 123a and the high refractive index layers 121b and 123b may have an optical thickness that is about an odd multiple of $\lambda/4$. The first reflective layer 121 may have about the same reflection rate as the second reflective layer 123. Also, each of the first and second reflective layers 121 and 123 may serve as a current path for supplying current to the active layer 122. To this end, the first reflective layer 121 and the second reflective layer 123 may be doped with dopants of opposite conductivity types. For example, the first reflective layer 121 may be an n-DBR layer doped with an n-type dopant, and the second reflective layer 123 may be a p-DBR layer doped with a p-type dopant. Alternatively, the first reflective layer 121 may be a p-DBR layer, and the second reflective layer 123 may be an n-DBR layer.

Figure 2:
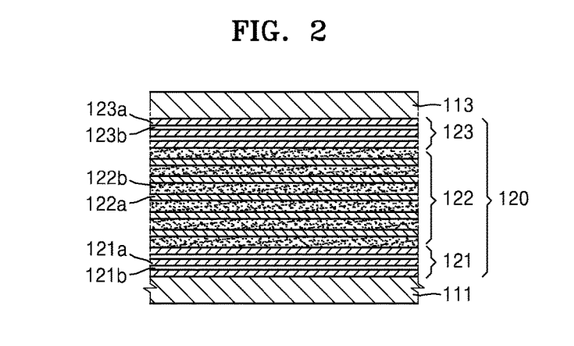
FIG. 2 is a detailed cross-sectional view of an exemplary structure of an epitaxial layer of the transmissive optical shutter shown in FIG. 1.

FIG. 2 is a schematic diagram of an exemplary structure of the epitaxial layer 120. However, the epitaxial layer 120 may be variously modified based on the structure shown in FIG. 2 to improve a bandwidth and a demodulation contrast of the transmissive optical shutter 100. For example, an additional cavity may be further interposed in at least one of the first reflective layer 121 and the second reflective layer 123. Alternatively, a plurality of quantum well layers 122a having different optical thicknesses may be disposed in the active layer 122. Alternatively, at least three reflective layers and at least two active layers may be alternately disposed. However, exemplary embodiments are not limited thereto, and the transmissive optical shutter 100 according to an exemplary embodiment may also include an epitaxial layer 120 configured to modulate light having a specific wavelength using an electro-absorption effect To inhibit a parasitic capacitance, the epitaxial layer 120 may not be formed on a single large-area cell but may be divided into a plurality of small cells. For example, FIG. 1 illustrates an example in which the epitaxial layer 120 is divided into two cells. However, exemplary embodiments are not limited thereto, and the epitaxial layer 120 may be divided into a plurality of cells that may form an arbitrary nxm two-dimensional matrix array. Here, each of n and m may be a natural number larger than 1 according to design specifications.

The first contact layer 111 and the second contact layer 113 may be respectively disposed on a bottom surface and a top surface of the epitaxial layer 120. The first and second contact layers 111 and 113 may serve to electrically connect the epitaxial layer 120 with the electrodes 112 and 116. For example, one first contact layer 111 may be disposed on the substrate 110, and the epitaxial layer 120 may be disposed on the first contact layer 111. The first reflective layer 121 of the epitaxial layer 120 may be in contact with the first contact layer 111. The second contact layer 113 may be disposed on the epitaxial layer 120. In particular, the second reflective layer 123 of the epitaxial layer 120 may be in contact with the second contact layer 113. When the epitaxial layer 120 is divided into at least two cells, the second contact layer 113 may be disposed on each of the cells. For example, the first contact layer 111 may be formed of a semiconductor material including indium gallium phosphide (InGaP). Also, the second contact layer 113 may be formed of a material that may serve as an electrical contact and transmit light having a resonance wavelength. For example, the second contact layer 113 may be formed of a semiconductor material including InGaP or GaAs.

Furthermore, the first contact layer 111 may be doped with a dopant having the same conductivity type as the first reflective layer 121, and the second contact layer 113 may be doped with a dopant having the same conductivity type as the second reflective layer 123. For example, when the first reflective layer 121 is doped with an n-type dopant and the second reflective layer 123 is doped with a p-type dopant, the first contact layer 111 may be formed of n-InGaP, and the second contact layer 113 may be formed of p-InGaP or p-GaAs. Also, when the first reflective layer 121 is doped with a p-type dopant and the second reflective layer 123 is doped with an n-type dopant, the first contact layer 111 may be formed of p-InGaP, and the second contact layer 113 may be formed of n-InGaP or n-GaAs.

The epitaxial layer 120 may be disposed on a portion of a top surface of the first contact layer 111, and the first electrode 112 may be disposed on the remaining region of the top surface of the first contact layer 111. Also, at least one second electrode 116 may be disposed on a top surface of the second contact layer 113. The first electrode 112 and the second electrode 116 may be formed of a conductive metal or a metal oxide. In the case of plural second electrodes 116, the at least one second electrodes 116 may be disposed a predetermined distance apart from one another to minimize the blocking of light and improve current injection efficiency. For example, the at least one second electrode 116 may be provided in the form of a fishbone-type lattice.

Since the entire thickness of the epitaxial layer 120 is only about 5 μm, the epitaxial layer 120 may be mechanically or chemically vulnerable. Accordingly, the transmissive optical shutter 100 may further include the insulating frame 114 to protect the epitaxial layer 120. The insulating frame 114 may be formed to cover the first contact layer 111 and the first electrode 112 and surround a side surface of the epitaxial layer 120. The insulating frame 114 may be formed of a low-k insulating material to minimize parasitic capacitance. For example, the insulating frame 114 may be formed of a material, such as benzocyclobutene (BCB) or polyimide (PI). The insulating frame material may also be disposed between adjacent cells of the epitaxial layer 120. An electrode pad 115 configured to connect an external power source with at least one second electrode 116 may be further disposed on a top surface of the insulating frame 114. A configuration in which the electrode pad 115 is electrically connected to the at least one second electrode 116 using a metal interconnection will be described below with reference to FIGS. 4A and 4B.

A passivation layer 117 may be formed over the epitaxial layer 120 to protect the second contact layer 113 and the second electrode 116. The passivation layer 117 may be formed of $SiO_2$ and extend to the electrode pad 115 formed of a metal.

A support layer 130 may be configured to support the transmissive optical shutter 100 disposed on the substrate 110, and formed of a transparent member, such as glass or sapphire. Accordingly, light incident to the support layer 130 may be transmitted through the support layer 130. A method of disposing the transmissive optical shutter 100 on a printed circuit board (PCB) substrate 200 using the support layer 130 will be described below with reference to FIG. 5.

FIGS. 3A through 3G are schematic cross-sectional views illustrating a process of fabricating the transmissive optical shutter 100.

Figure 3A:
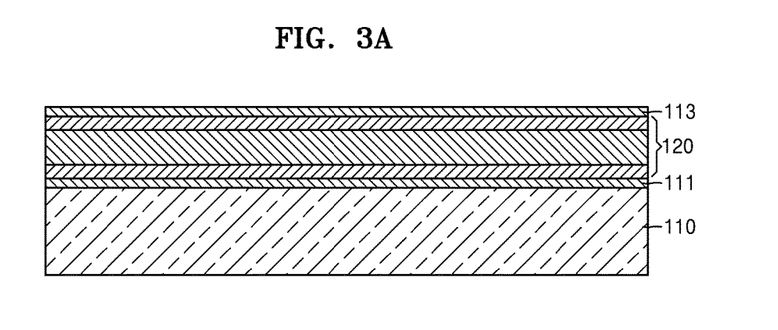
FIGS. 3A through 3G are schematic cross-sectional views illustrating a process of fabricating the transmissive optical shutter shown in FIG. 1.

Referring to FIG. 3A, a first contact layer 111 may be formed on a top surface of a substrate 110 formed of, for example, GaAs. As described above, the first contact layer 111 may be formed of n-InGaP or p-InGaP. Also, an epitaxial layer 120 may be grown on the first contact layer 111. The epitaxial layer 120 may be formed by sequentially forming a first reflective layer 121, an active layer 122, and a second reflective layer 123 using an epitaxial growth process. As described above, the epitaxial layer 120 may have various other structures other than the structure shown in FIG. 2. Next, a second contact layer 113 may be formed on the epitaxial layer 120. For example, the second contact layer 113 may be formed of p-InGaP, p-GaAs, n-InGaP, or n-GaAs.

Figure 3B:
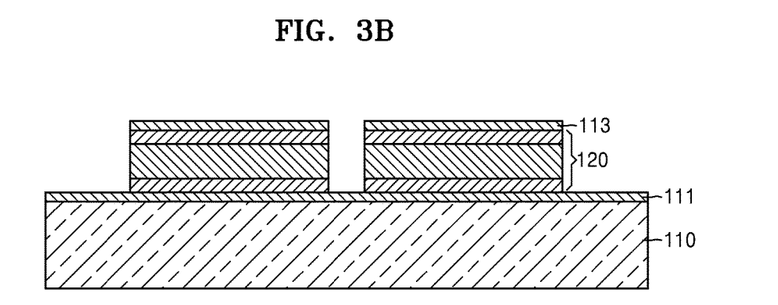

Referring to FIG. 3B, the epitaxial layer 120 and the second contact layer 113 may be partially etched using a mesa etching process such that a portion of the first contact layer 111 is exposed. In this process, the epitaxial layer 120 may be divided into a plurality of cells. Although FIG. 3B illustrates an example in which the epitaxial layer 120 is divided into two cells, exemplary embodiments are not limited thereto, and the epitaxial layer 120 may not be divided into a plurality of cells. In this case, only an edge portion of the epitaxial layer 120 may be etched to expose a portion of the first contact layer 111.

Figure 3C:
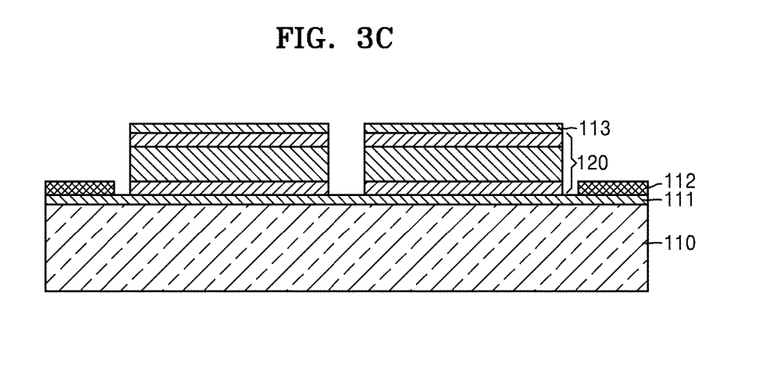
Figure 3D:
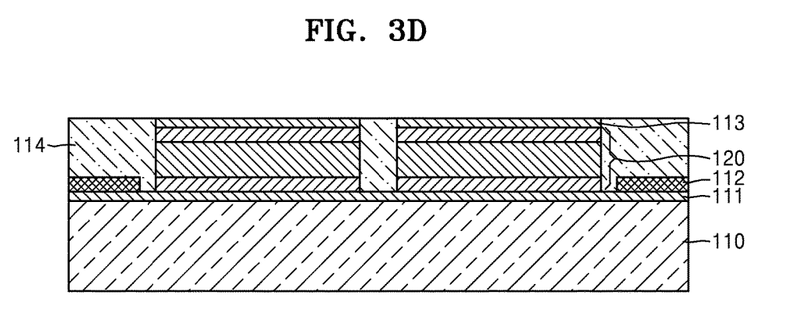

Referring to FIGS. 3C and 3D, after the first electrode 112 is formed on the exposed top surface of the first contact layer 111, an insulating frame 114 may be formed to cover the first electrode 112 and the first contact layer 111 and cover exposed side surfaces of the epitaxial layer 120. Here, a top surface of the insulating frame 114 may be formed at the same level as a top surface of the second contact layer 113 such that there is little step difference between the top surfaces of the insulating frame 114 and the second contact layer 113. Also, the top surface of the insulating frame 114 and the top surface of the second contact layer 113 may be disposed on the same plane. The insulating frame 114 may be filled between the divided cells of the epitaxial layer 120.

Figure 3E:
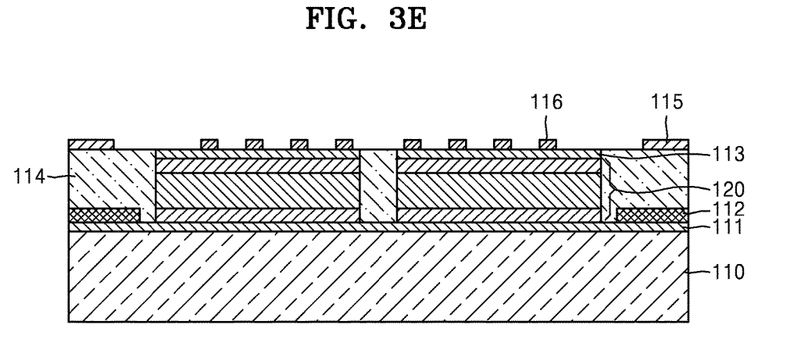

Referring to FIG. 3E, a second electrode 116 may be formed on the second contact layer 113, and an electrode pad 115 may be formed on the insulating frame 114. The second electrode 116 and the electrode pad 115 may be formed of the same material simultaneously. For instance, one conductive material layer may be formed on the top surface of the second contact layer 113 and the top surface of the insulating frame 114, and patterned, thereby forming a second electrode 116 and an electrode pad 115.

Figure 3F:
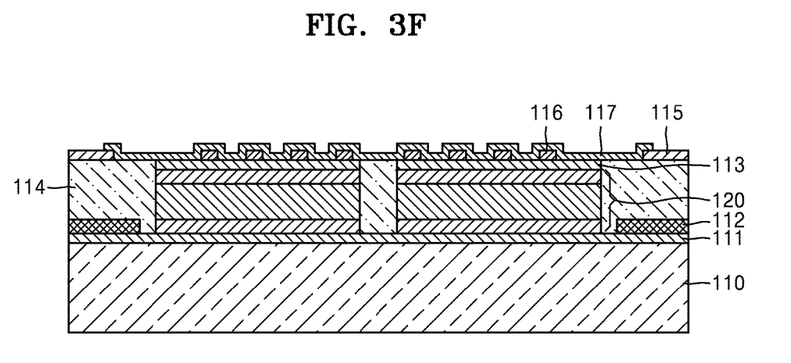

Referring to FIG. 3F, a passivation layer 117 may be formed to cover the second contact layer 113 and the second electrode 116. As described above, the passivation layer 117 may be formed of, for example, $SiO_2$. The passivation layer 117 may be formed to a predetermined thickness to cover entire surfaces of the second electrode 116, the electrode pad 115, the second contact layer 113, and the insulating frame 114. A portion of the passivation layer 117 formed on the electrode pad 115 may be removed. Thus, the passivation layer 117 may extend to cover the second electrode 116 and contact a portion of a top surface of the electrode pad 115.

When light having a specific wavelength band of, for example, about 940 nm is incident on the transmissive optical shutter 100, the light passes through the shutter. Since an additional process for forming an opening in the substrate 110 formed of GaAs is not needed, additional processes for removing a portion of the substrate 110 (e.g., a process of etching the substrate 110) may not be necessary. Thus, yield of the transmissive optical shutter 100 may be increased by reducing the number of fabrication processes. Further, an unnecessary loss region, which may occur if the process of removing the portion of the substrate 110 is necessary, may be avoided. As a result, the entire transmissive optical shutter 100 may have a reduced size.

Furthermore, the transmissive optical shutter 100 according to the present embodiment may be fabricated in large quantities on a wafer level by performing the processes shown in FIGS. 3A through 3F by using, for example, a chemical vapor deposition (CVD) process, on the wafer level during a semiconductor wafer process. In addition, after the process shown in FIG. 3F is completed, a plurality of transmissive optical shutters 100 formed on one wafer may be diced.

Figure 3G:
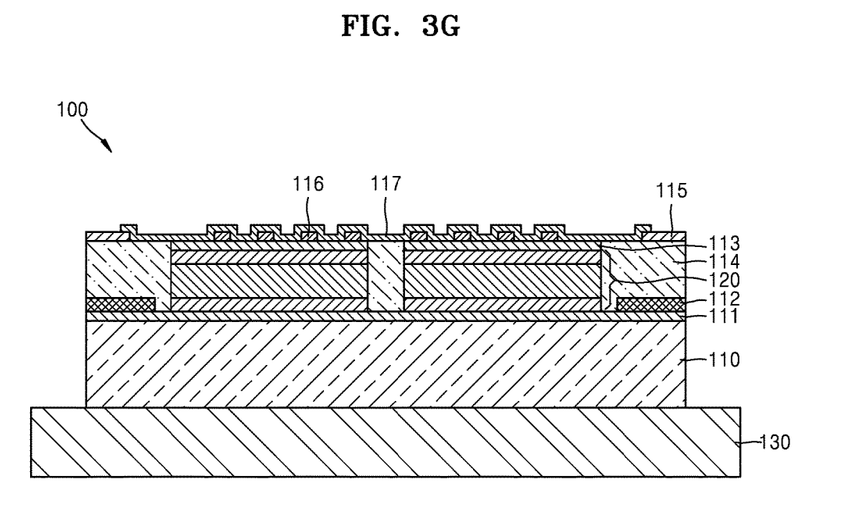

Referring to FIG. 3G, a support layer 130 capable of supporting the transmissive optical shutter 100 may be adhered to a bottom surface of the substrate 110. In this case, an adhesive (e.g., a transparent epoxy-based adhesive) that is transparent with respect to incident light having a wavelength band of, for example, about 940 nm, may be used to adhere the substrate 110 to the support layer 130. The support layer 130 may be formed using a transparent member, for example, glass or sapphire. A method of assembling the transmissive optical shutter 100 in a PCB using the support layer 130 will be described below with reference to FIG. 5.

Figure 4A:
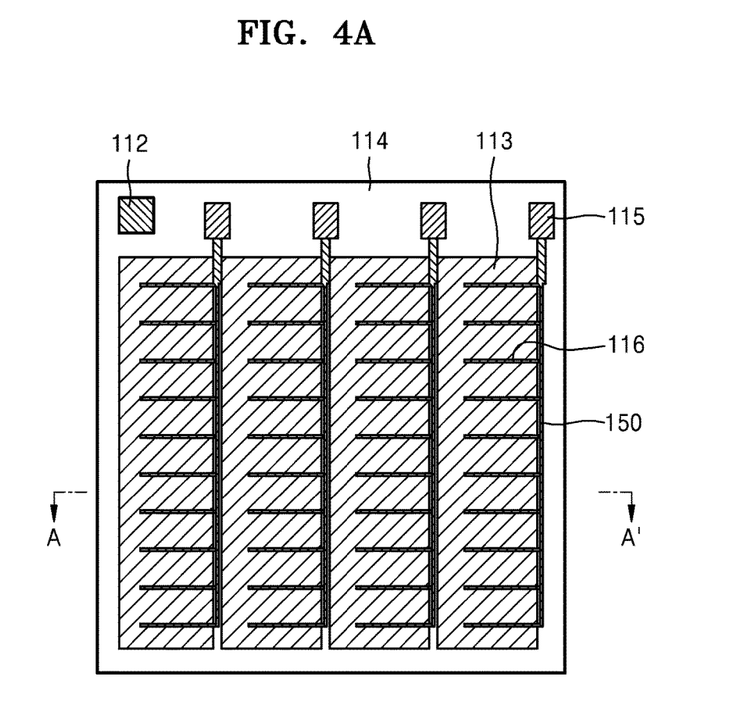
FIG. 4A is a plan view of a transmissive optical shutter according to an exemplary embodiment.
Figure 4B:
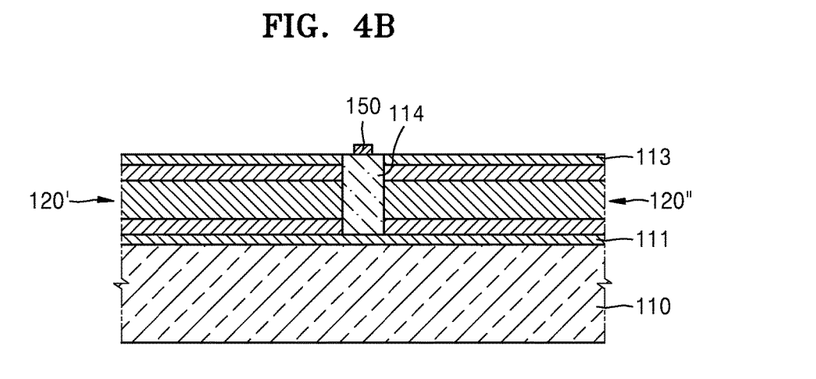
FIG. 4B is a partial cross-sectional view of the transmissive optical shutter shown in FIG. 4A.

FIG. 4A is a plan view of a transmissive optical shutter 100 according to an exemplary embodiment, and FIG. 4B is a partial cross-sectional view of the transmissive optical shutter shown in FIG. 4A. FIG. 4A can be considered the plan view of the left-band cell of the embodiment shown in FIG. 1.

The transmissive optical shutter 100 according to the present exemplary embodiment may include a substrate 110, a first contact layer 111 disposed on the substrate 110, and an epitaxial layer 120 disposed on the first contact layer 111. As described above, to inhibit a parasitic capacitance, the epitaxial layer 120 may not be formed as a single large-area cell but divided into a plurality of small cells that form, for example, an arbitrary n×m two-dimensional matrix array. Here, each of n and m may be a natural number larger than 1. Referring to FIGS. 4A and 4B, the epitaxial layer 120 may include four cells. The cells are formed a predetermined distance apart from each other. A second contact layer 113 may be disposed on the epitaxial layer 120. At least one second electrode 116 may be disposed on a top surface of the second contact layer 113. In this case, the at least one second electrode 116 may be provided in the form of, for example, a fishbone-type lattice to minimize the blocking of light and improve current injection efficiency. An electrode pad 115 may be disposed to connect an external power source to the at least one second electrode 116, and a bus bar 150 may be disposed between the electrode pad 115 and the at least one second electrode 116 to electrically connect the at least one second electrode 116 with the electrode pad 115.

FIG. 4B shows a partial cross-sectional view taken along line A-A' in FIG. 4A. Referring to FIG. 4B, an insulating frame 114 may be formed to surround a side surface of the epitaxial layer 120 to protect the epitaxial layer 120. Accordingly, the insulating frame 114 may be disposed in a space between a first epitaxial layer 121 and a second epitaxial layer 122 formed in the units of cells. A region in which the insulating frame 114 is disposed between the first epitaxial layer 121 and the second epitaxial layer 122 may not be optically used.

The bus bar 150 may be formed of a conductive metal to connect the at least one second electrode 116 and electrode pad 115. As a result, light may be blocked to reduce optical efficiency. When the bus bar 150 is disposed in the region formed between a plurality of cells (e.g., between the first epitaxial layer 120' and the second epitaxial layer 120") which form part of the epitaxial layer 120, the blocking of light due to the bus bar 150 may be prevented. This placement improves a fill factor and increases optical efficiency. In this case, the bus bar 150 may be disposed on the insulating frame 114 formed between the first epitaxial layer 120' and the second epitaxial layer 120", and connected to one end portion of the at least one second electrode 116 so that the electrode pad 115 can be electrically connected to the at least one second electrode 116. The bus bar 150 can also be formed with a transparent conductor to improve transmission.

Figure 5:
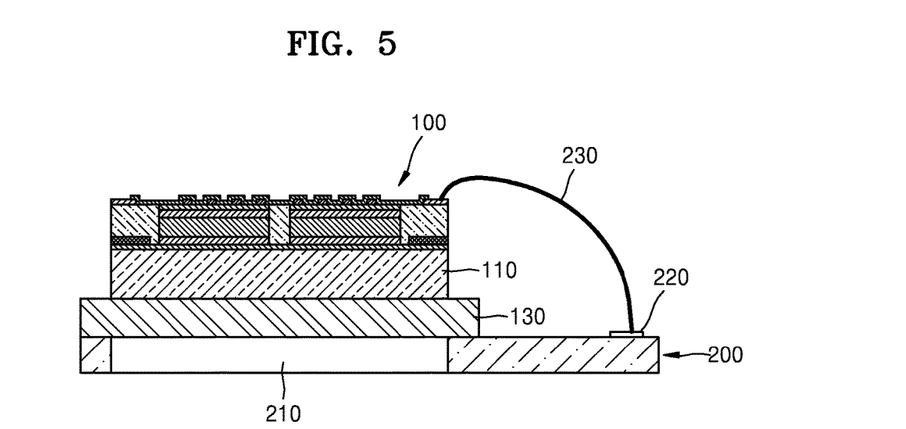
FIG. 5 is a cross-sectional view of a printed circuit board (PCB) substrate on which a transmissive optical shutter according to an exemplary embodiment is mounted.

FIG. 5 is a cross-sectional view of a PCB substrate 200 on which a transmissive optical shutter 100 according to an exemplary embodiment is mounted.

To assemble the transmissive optical shutter 100 in the PCB substrate 200, the transmissive optical shutter 100 may be combined with an opening 210 formed in the PCB substrate 200. As described above, since a process of forming an opening in a substrate 110 becomes unnecessary, the size of the transmissive optical shutter 100 may be reduced. Thus, the size of the transmissive optical shutter 100 may be different from the size of the opening 210. Referring to FIG. 5, a support layer 130 formed of a transparent member, which may support the transmissive optical shutter 100, may be adhered to a bottom surface of the substrate 110, and the transmissive optical shutter 100 may be disposed on the PCB substrate 200 using the support layer 130 irrespective of the entire size thereof. An electrode pad 115 may be electrically connected to a terminal portion 220 of the PCB substrate 200 using a connection portion 230.

When a 3D image capturing device is embodied using the transmissive optical shutter 100 to which the support layer 130 is adhered, the support layer 130 formed of a transparent member may be used as a bandpass filter (BPF) to reduce a size of the entire 3D image capturing device.

As described above, according to the one or more of the above exemplary embodiments, a transmissive optical shutter and a method of fabricating a transmissive optical shutter are provided.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A transmissive optical shutter comprising:
    a first contact layer;
    an epitaxial layer disposed over the first contact layer, the epitaxial layer being configured to modulate intensity of incident light having a specific wavelength;
    a second contact layer disposed on the epitaxial layer;
    a first electrode disposed on the first contact layer;
    at least one second electrode disposed on the second contact layer; and
    a substrate disposed under the first contact layer,
    wherein the epitaxial layer is divided into a plurality of cells that form a two-dimensional matrix array,
    wherein the plurality of cells are spaced from one another, and
    the optical shutter further comprising a bus bar extending along a region formed between the plurality of cells and connected to one end portion of the at least one second electrode,
    wherein a wavelength band of the incident light is about 870 nm or more, and the substrate is formed without an opening.

2. The transmissive optical shutter of claim 1, further comprising an insulating frame disposed on the first contact layer, the insulating frame surrounding a side surface of the epitaxial layer.

3. The transmissive optical shutter of claim 2, further comprising an electrode pad disposed on the insulating frame, the electrode pad being electrically connected to the second electrode.

4. The transmissive optical shutter of claim 1, further comprising a passivation layer that covers the second electrode and the second contact layer.

5. The transmissive optical shutter of claim 1, wherein the epitaxial layer comprises a first reflective layer in contact with the first contact layer, a second reflective layer in contact with the second contact layer, and an active layer interposed between the first reflective layer and the second reflective layer.

6. The transmissive optical shutter of claim 5, wherein the first contact layer and the first reflective layer are doped with a dopant of a first conductivity type, and the second contact layer and the second reflective layer are doped with a dopant of a second conductivity type opposite the first conductivity type.

7. The transmissive optical shutter of claim 1, further comprising a support layer disposed under the substrate.

8. The transmissive optical shutter of claim 7, wherein the support layer comprises glass or sapphire.

9. The transmissive optical shutter of claim 1, wherein the at least one second electrode comprises a plurality of second electrodes positioned on the second contact layer apart from one another, and
    the bus bar electrically connects the at least one second electrode with an electrode pad.

10. The transmissive optical shutter of claim 2, wherein the insulating frame is disposed between the plurality of cells, and
    the bus bar is disposed on the insulating frame.

11. A transmissive optical shutter comprising:
a first contact layer;
an epitaxial layer disposed over the first contact layer, the epitaxial layer being configured to modulate intensity of incident light having a specific wavelength;
a second contact layer disposed on the epitaxial layer;
a first electrode disposed on the first contact layer;
at least one second electrode disposed on the second contact layer; and
a substrate disposed under the first contact layer, and
further comprising an insulating frame disposed on the first contact layer, wherein a top surface of the insulating frame is at a same level as a top surface of the second contact layer.

12. A method of fabricating a transmissive optical shutter, the method comprising:
sequentially stacking a first contact layer, an epitaxial layer having a plurality of cells separated from each other, and a second contact layer on a substrate;
etching the epitaxial layer and the second contact layer to expose a portion of the first contact layer;
forming a first electrode on the exposed portion of the first contact layer;
forming at least one second electrode on the second contact layer, and
forming a bus bar disposed in a region between the plurality of cells to connect with at least one of the second electrodes.

13. The method of claim 12, wherein a wavelength band of incident light is about 870 nm or more.

14. The method of claim 12, further comprising forming an electrode pad on the insulating frame to be electrically connected to the second electrode,
wherein the electrode pad and the second electrode are formed simultaneously.

15. The method of claim 12, further comprising forming a passivation layer to cover the second electrode and the second contact layer.

16. The method of claim 12, further comprising forming a support layer under the substrate.

17. The method of claim 12, wherein sequential stacking of the first contact layer, the epitaxial layer, and the second contact layer on the substrate is wholly performed in a semiconductor wafer process, and
the method further comprises performing a dicing process after the sequential stacking of the first contact layer, the epitaxial layer, and the second contact layer.

18. The method of claim 12, further comprising, after the forming of the first electrode and before the forming of the at least one second electrode, forming an insulating frame to cover the first contact layer and the first electrode and cover a side surface of the epitaxial layer.

* * * * *